(12) United States Patent
Chen et al.

(10) Patent No.: US 9,214,601 B1
(45) Date of Patent: Dec. 15, 2015

(54) ELECTROLUMINESCENT AND PHOTOLUMINESCENT MULTIBAND WHITE LIGHT EMITTING DIODE

(71) Applicant: HIGH POWER OPTO. INC., Taichung (TW)

(72) Inventors: Fu-Bang Chen, Taichung (TW);
Yen-Chin Wang, Taichung (TW);
Wei-Yu Yen, Taichung (TW);
Shih-Hsien Huang, Taichung (TW);
Chih-Sung Chang, Taichung (TW)

(73) Assignee: HIGH POWER OPTO, INC., Taichung (TW)

( * ) Notice: Subject to any disclaimer, the term of this patent is extended or adjusted under 35 U.S.C. 154(b) by 0 days.

(21) Appl. No.: 14/587,729

(22) Filed: Dec. 31, 2014

(51) Int. Cl.
*H01L 33/00* (2010.01)
*H01L 33/08* (2010.01)
*H01L 33/14* (2010.01)
*H01L 33/10* (2010.01)
*H01L 33/44* (2010.01)
*H01L 33/32* (2010.01)

(52) U.S. Cl.
CPC ............... *H01L 33/08* (2013.01); *H01L 33/10* (2013.01); *H01L 33/145* (2013.01); *H01L 33/32* (2013.01); *H01L 33/325* (2013.01); *H01L 33/44* (2013.01)

(58) Field of Classification Search
CPC ......... H01L 33/60; H01L 33/20; H01L 33/62; H01L 33/54; H01L 33/44
USPC ........................................................... 257/98
See application file for complete search history.

(56) References Cited

U.S. PATENT DOCUMENTS

| | | | |
|---|---|---|---|
| 7,223,998 B2 | 5/2007 | Schwach et al. | |
| 2006/0114371 A1* | 6/2006 | Peterson | G02F 1/133617 349/61 |
| 2007/0120129 A1* | 5/2007 | DenBaars | H01L 33/025 257/79 |
| 2009/0001389 A1* | 1/2009 | Wang | H01L 27/15 257/89 |

* cited by examiner

*Primary Examiner* — Lex Malsawma
*Assistant Examiner* — Long Le
(74) *Attorney, Agent, or Firm* — Muncy, Geissler, Olds & Lowe, P.C.

(57) ABSTRACT

An electroluminescent and photoluminescent white light emitting diode (LED) includes an electroluminescent light emitting structure, a first photoluminescent light emitting layer, a second photoluminescent light emitting layer and a red light emitting layer. The electroluminescent light emitting structure emits a violet light having a wavelength between 395 nm and 450 nm and an FWHM smaller than 25 nm. The first photoluminescent light emitting layer and the second photoluminescent light emitting layer are sequentially disposed on the electroluminescent light emitting structure. The first photoluminescent light emitting layer absorbs the violet light to generate a blue light. The second photoluminescent light emitting layer absorbs the violet light and the blue light to generate a green light. The red light emitting layer generates a red light. Accordingly, the violet light, the blue light, the green light and the red light are blended to form a white light having a high color rendering index.

9 Claims, 6 Drawing Sheets

ELECTROLUMINESCENT AND PHOTOLUMINESCENT MULTIBAND WHITE LIGHT EMITTING DIODE

FIELD OF THE INVENTION

The present invention relates to a white light emitting diode (LED), and particularly to a white LED having a high color rendering index (CRI).

BACKGROUND OF THE INVENTION

FIG. 1 shows a conventional vertical light emitting diode (LED), which includes a sandwich structure formed by an N-type semiconductor layer 1A, an active layer 2A and a P-type semiconductor layer 3A. Below the P-type semiconductor layer 3A, a substrate 4A and a P-type electrode 5A are sequentially formed. An N-type electrode 6A is disposed at a surface of the N-type semiconductor layer 1A.

By applying a forward bias between the N-type electrode 6A and the P-type electrode 5A, the N-type semiconductor layer 1A and the P-type semiconductor layer 3A provide electrons and holes, respectively. The electrons and holes are combined in the active layer 2A to perform energy level jump to further generate an excited light having a constant wavelength.

FIG. 2 shows a conventional horizontal LED, which similarly includes a sandwich structure formed by an N-type semiconductor layer 1B, an active layer 2B and a P-type semiconductor layer 3B. The N-type semiconductor layer 1B is formed on a substrate 4A, and a P-type electrode 5B and an N-type electrode 6B are respectively disposed at same sides of the P-type semiconductor layer 3B and the N-type semiconductor layer 1B. By applying a voltage between the N-type electrode 6B and the P-type electrode 5B, electrons and holes are combined in the active layer 2B to generate an excited light.

Referring to FIG. 3, the U.S. Pat. No. 7,223,988, "White, Single or Multi-color Light Emitting Diodes by Recycling Guided Modes", discloses a photon recycling LED that mainly includes a nitride LED 9. On the nitride LED 9, a non-doped semiconductor layer 9A, a nitride photoluminescent active layer 9B and another non-doped semiconductor layer 9A are sequentially stacked. An electroluminescent light 9C (blue light) generated by the nitride LED 9 enters the nitride photoluminescent active layer 9B to generate a photoluminescent light 9D (yellow) having another wavelength. In other words, the presence of the nitride photoluminescent active layer 9B is to generate a photoluminescent light having another wavelength, i.e., lights of multiple colors are allowed to be blended, and further blended with a red light from a red light emitting substance, a photoluminescent red phosphorescent light emitting substance or red quantum dots, thereby generating a white light with a preferred color rendering index (CRI).

In the prior art, the nitride photoluminescent active layer 9B is provided to absorb the electroluminescent light 9C (blue light) to accordingly generate the photoluminescent light 9D (yellow light), followed by blending the lights to produce a white light having a preferred CRI. However, the actual white light includes colors ranging from red, orange, yellow, green, blue, indigo to violet. It is obvious that, the white light produced by the prior art does not include some of the colors of the actual white light, and lacks a realistic CRI that fully matches the requirements of the actual white light.

SUMMARY OF THE INVENTION

It is a primary object of the present invention to provide a white light emitting diode (LED) having a high color rending index (CRI) that satisfies requirements of the liquid crystal display (LCD) industry and art lights.

To achieve the above object, the present invention provides an electroluminescent and photoluminescent multiband white LED. The electroluminescent and photoluminescent multiband white LED of the present invention includes an electroluminescent light emitting structure, a first photoluminescent light emitting layer, a second photoluminescent light emitting layer, and a red light emitting layer. The electroluminescent light emitting layer includes: an electroluminescent light emitting active layer, receiving a forward bias to emit a violet light having a wavelength between 395 nm and 450 nm and a full width at half maximum (FWHM) smaller than 25 nm; and a P-type semiconductor layer and a first N-type semiconductor layer, respectively disposed at two sides of the electroluminescent light emitting active layer. The first photoluminescent light emitting layer is spaced by the first N-type semiconductor layer to be disposed on the electroluminescent light emitting structure, and absorbs the violet light to emit a blue light. The second photoluminescent light emitting layer is spaced by a second N-type semiconductor layer to be disposed on the first photoluminescent light emitting layer, and absorbs the violet light and the blue light to emit a green light. The red light emitting layer is sequentially spaced by a protection layer and a third N-type semiconductor layer to be disposed on the second photoluminescent light emitting layer, and generates a red light. The red light, the green light, the blue light and the violet light are blended to form a white light having a high CRI to satisfy requirements of the LCD industry and art lights.

Accordingly, in the present invention, a white light having a high CRI is formed through a design of multiple light emitting layers. Further, the electroluminescent light emitting structure of the present invention generates the violet light, based on which the blue light and the green light are generated by a photoluminescent light emitting approach. Using a matured technology, the red light is generated from a red light emitting substance, a photoluminescent red phosphorescent light emitting substance or red quantum dots. As the violet light is produced at a low cost, the present invention not only is capable of producing the white light having a high CRI but also effectively reduces costs to satisfy manufacturing requirements.

DETAILED DESCRIPTION OF THE PREFERRED EMBODIMENTS

The foregoing, as well as additional objects, features and advantages of the invention will be more readily apparent from the following detailed description, which proceeds with reference to the accompanying drawings.

Figure 1:
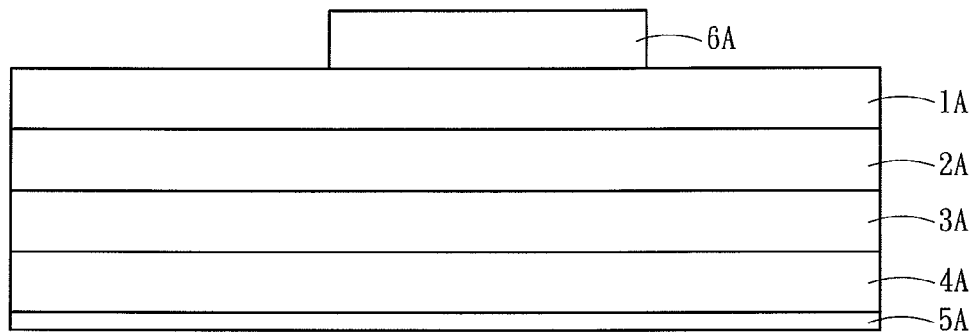
FIG. 1 is a structural diagram of a conventional vertical light emitting diode (LED).
Figure 2:
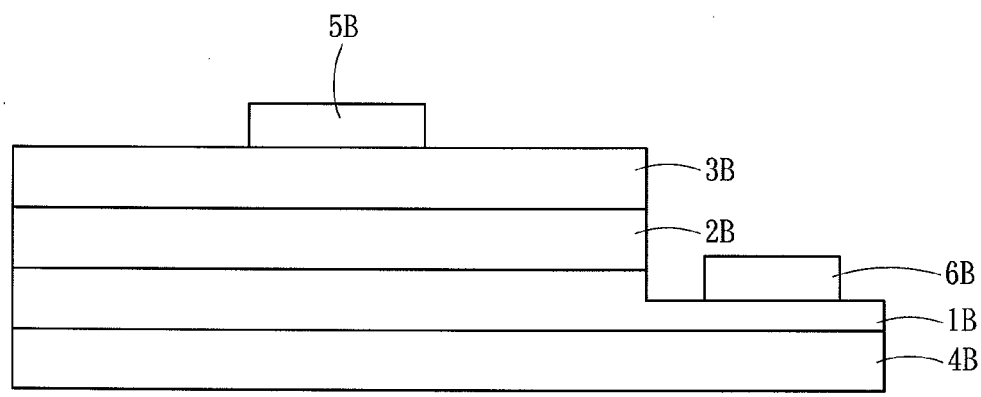
FIG. 2 is a structural diagram of a conventional horizontal LED.
Figure 3:
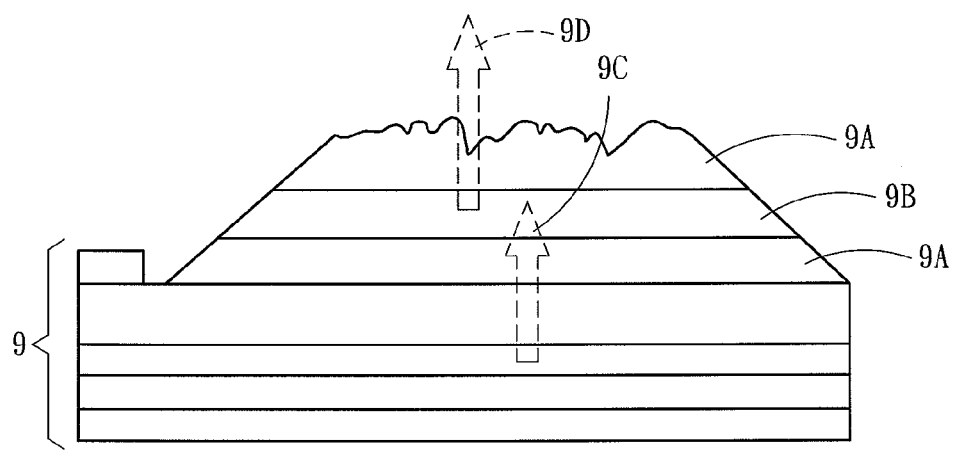
FIG. 3 is a structural diagram of a conventional photoluminescent LED.
Figure 4:
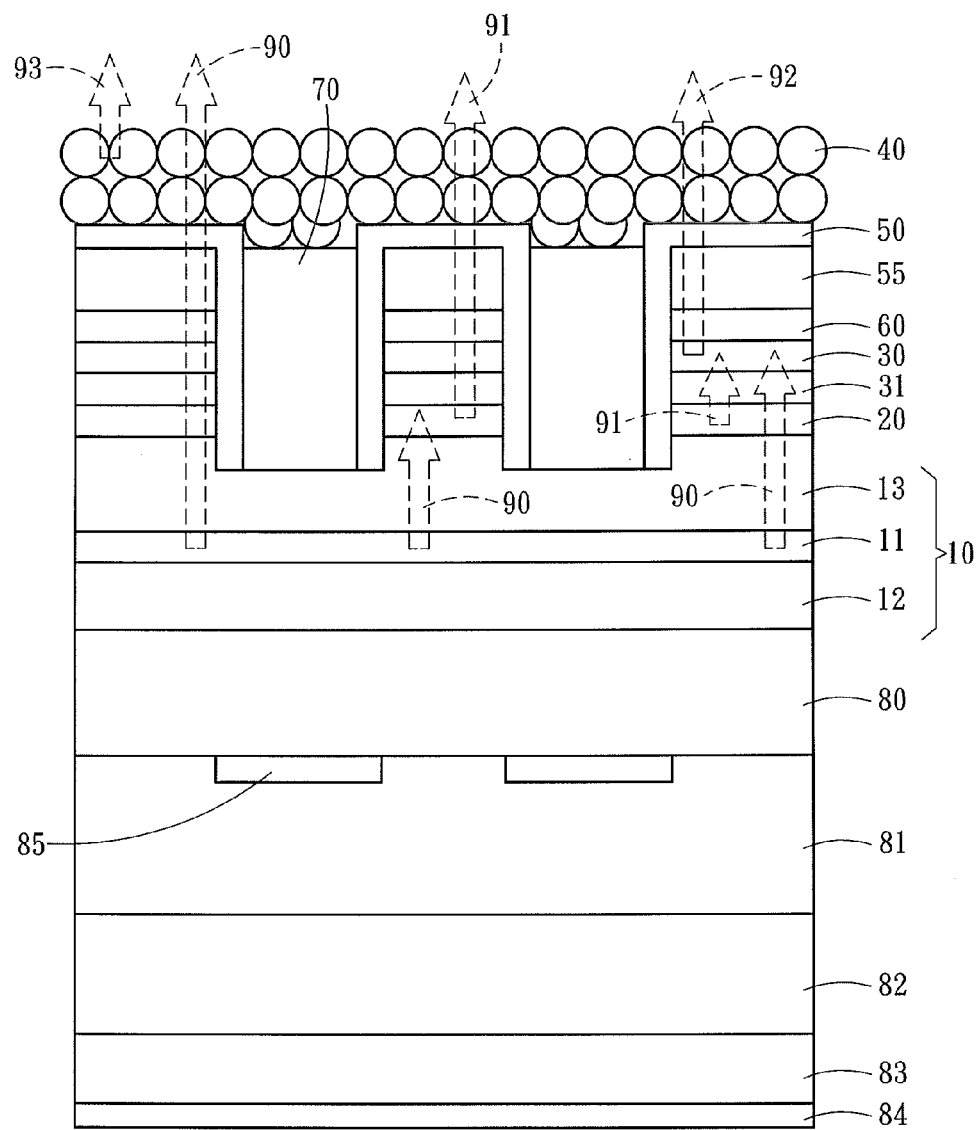
FIG. 4 is a structural diagram of the present invention.
Figure 5:
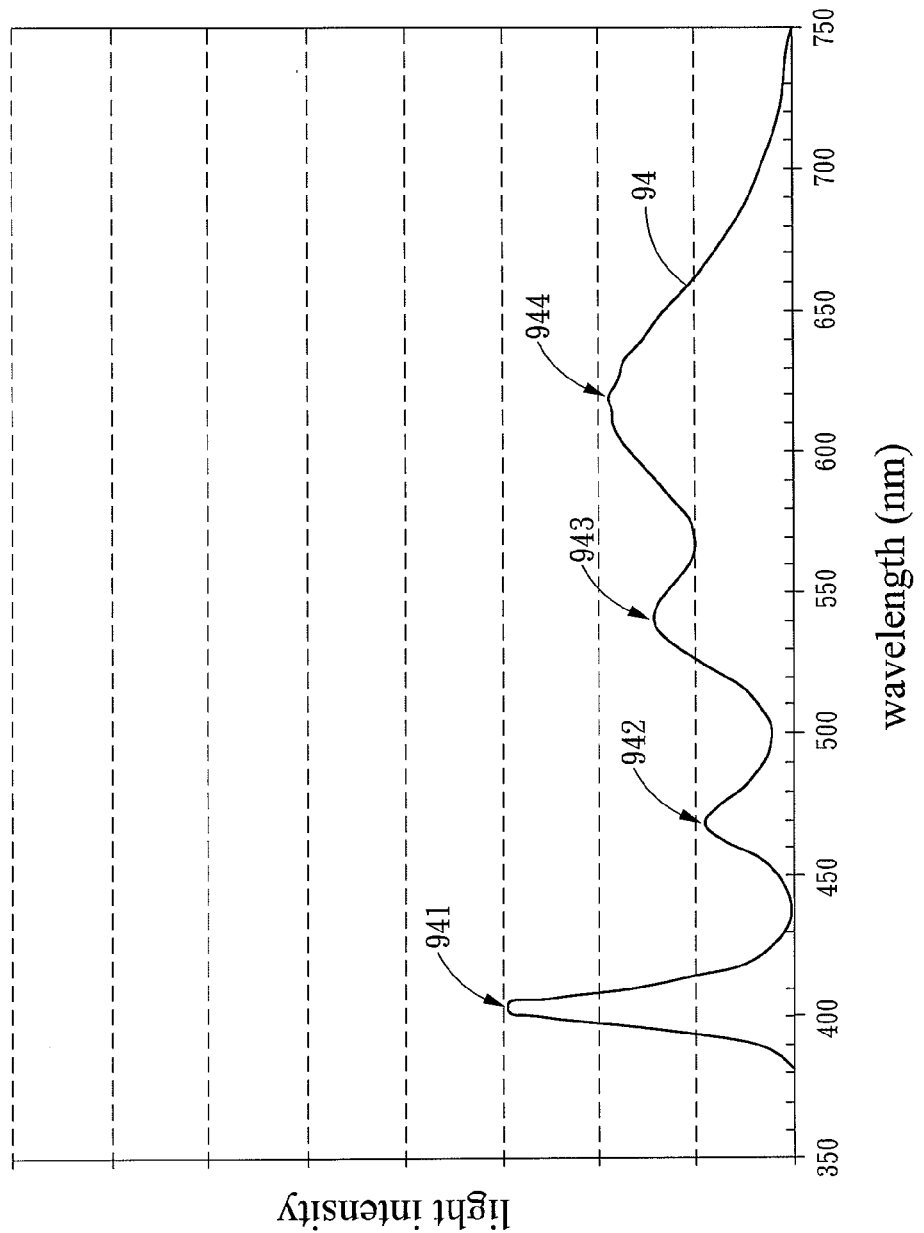
FIG. 5 is a spectrum diagram of a white light of the present invention.

Referring to FIG. 4 and FIG. 5, an electroluminescent and photoluminescent multiband white light emitting diode (LED) of the present invention includes an electroluminescent light emitting structure 10, a first photoluminescent light emitting layer 20, a second photoluminescent light emitting layer 30, and a red light emitting layer 40. The electroluminescent light emitting structure 10 includes an electroluminescent light emitting active layer 11, and a P-type semiconductor layer 12 and a first N-type semiconductor layer 13 respectively disposed at two sides of the electroluminescent light emitting active layer 11. The electroluminescent light emitting active layer 11 receives a forward bias and emits a violet light 90 having a wavelength between 390 nm and 450 nm and a full width at half maximum (FWHM) smaller than 25 nm.

The first photoluminescent light emitting layer 20 is spaced by the first N-type semiconductor layer 13 to be disposed on the electroluminescent light emitting structure 10, and absorbs the violet light 90 to emit a blue light 91. A material of the first photoluminescent light emitting layer 20 is selected to render the blue light 91 to have a wavelength between 445 nm and 465 nm and an FWHM greater than 20 nm, e.g., the material is selected from a blue light material $In_xGa_{1-x}N/GaN$, where x=0.1~0.2.

The second photoluminescent light emitting layer 30 is spaced by a second N-type semiconductor layer 31 to be disposed on the first photoluminescent light emitting layer 20, and absorbs the violet light 90 and the blue light 91 to emit a green light 92. A material of the second photoluminescent light emitting layer 30 is selected to render the green light 92 to have a wavelength between 490 nm and 540 nm and an FWHM greater than 20 nm, e.g., the material is selected from a green light material $In_xGa_{1-x}N/GaN$, where x=0.2~0.3.

The red light emitting layer 40 is sequentially spaced by a protection layer 50 and a third N-type semiconductor layer 60 to be disposed on the second photoluminescent light emitting layer 30 and generates a red light 93. The red light emitting layer 40 may be one of a red light emitting substance, a photoluminescent red phosphorescent light emitting substance and red quantum dots. For example, the red light emitting layer 40 may be selected from a red light material such as a nitride doped with $Eu^{2+}$ or $Mn^{4+}$. A wavelength of the red light 93 may be between 600 nm and 750 nm.

FIG. 5 shows a spectrum diagram of a blended white light 94 of the present invention. As seen, the white light 94 includes a violet light peak 941, a blue light peak 942, a green light peak 943 and a red light peak 944. That is, the white light 94 is formed from mixing the violet light 90, the blue light 91, the green light 92 and the red light 93, and has a high CRI to satisfy requirements of the LCD industry and art lights.

To ensure that the violet light 90 emitted from the electroluminescent light emitting active layer 11 is not entirely converted to the blue light 91 and the green light 92, an area of the electroluminescent light emitting active layer 11 may be greater than or equal to those of the first photoluminescent light emitting layer 20 and the second photoluminescent light emitting layer 30. As such, it is ensured that the electroluminescent light emitting active layer 11 be provided with sufficient electroluminescent violet light 90 that passes through the first photoluminescent light emitting layer 20 and the second photoluminescent light emitting layer 30.

To provide the electroluminescent light emitting active layer 11 with a forward bias, the present invention further includes an N-type electrode 70. The N-type electrode 70 penetrates through the protection layer 50, the third N-type semiconductor layer 60, the second photoluminescent light emitting layer 30, the second N-type semiconductor layer 31, and the first photoluminescent light emitting layer 20. Further, the N-type electrode 70 is in contact with the first N-type semiconductor layer 13. Below the P-type semiconductor layer 12, a mirror layer 80, a buffer layer 81, a binding layer 82, a substrate 83 and a P-type electrode 84 are sequentially disposed. Given a forward bias is provided between the N-type electrode 70 and the P-type electrode 84, the violet light 90 can be generated and emitted.

For luminance uniformity, a current block layer 85 corresponding to the N-type electrode 70 may be provided between the mirror layer 80 and the buffer layer 81. The current block layer 85 provides a blocking effect and distributes a current to enhance the luminance uniformity. Further, a position of the current block layer 85 may be selected to correspond to the N-type electrode 70, so as to have a light emitting region effectively avoid the N-type electrode 70 to enhance luminance uniformity.

A non-doped semiconductor layer 55 may be further disposed between the protection layer 50 and the third N-type semiconductor layer 60. The non-doped semiconductor layer 55 may be a light reflecting or roughened structure to further increase the luminance.

Figure 6:
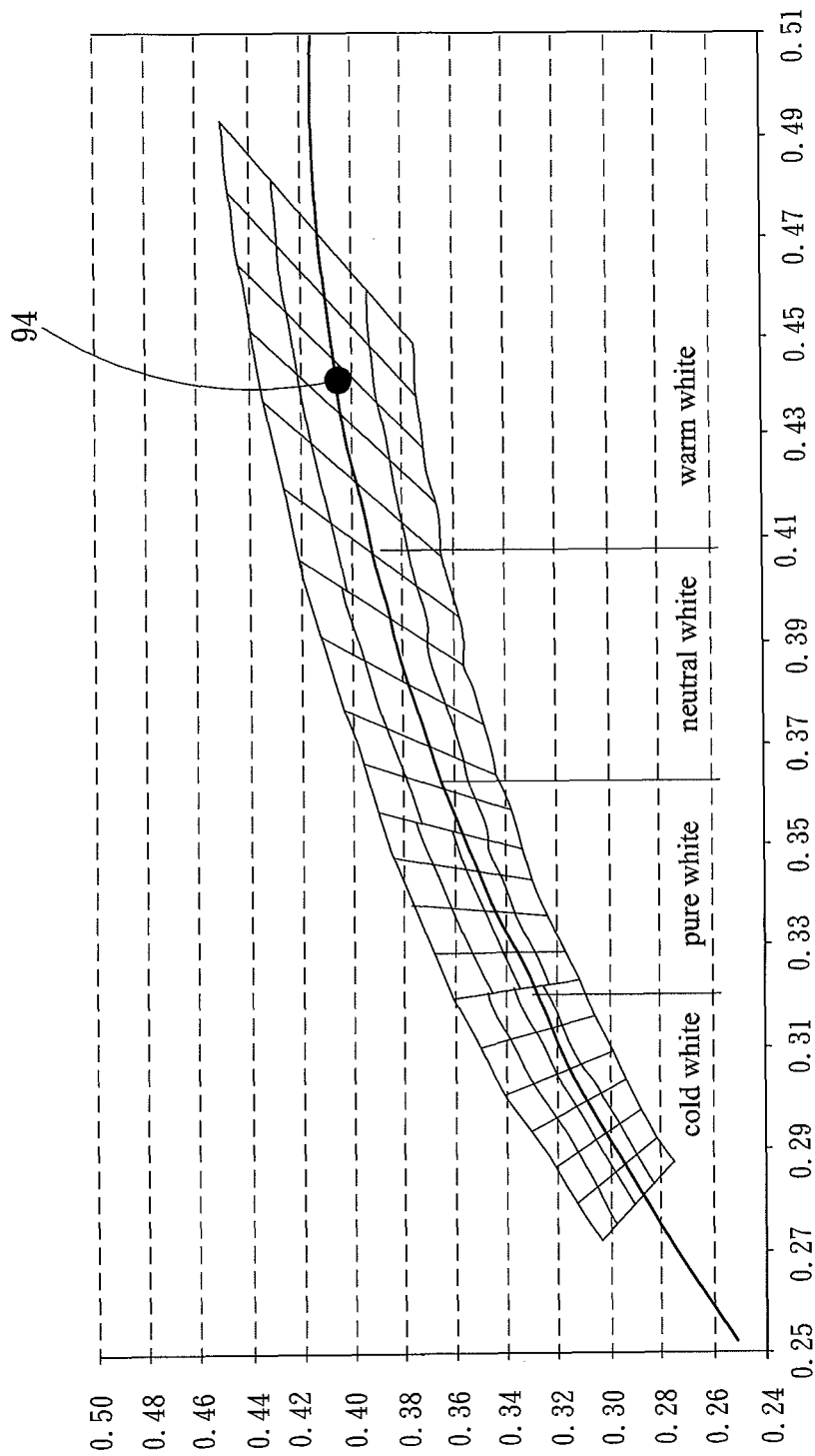
FIG. 6 is a coordinate diagram of chromaticity of a CIE 1931 color space of the present invention.
Figure 7:
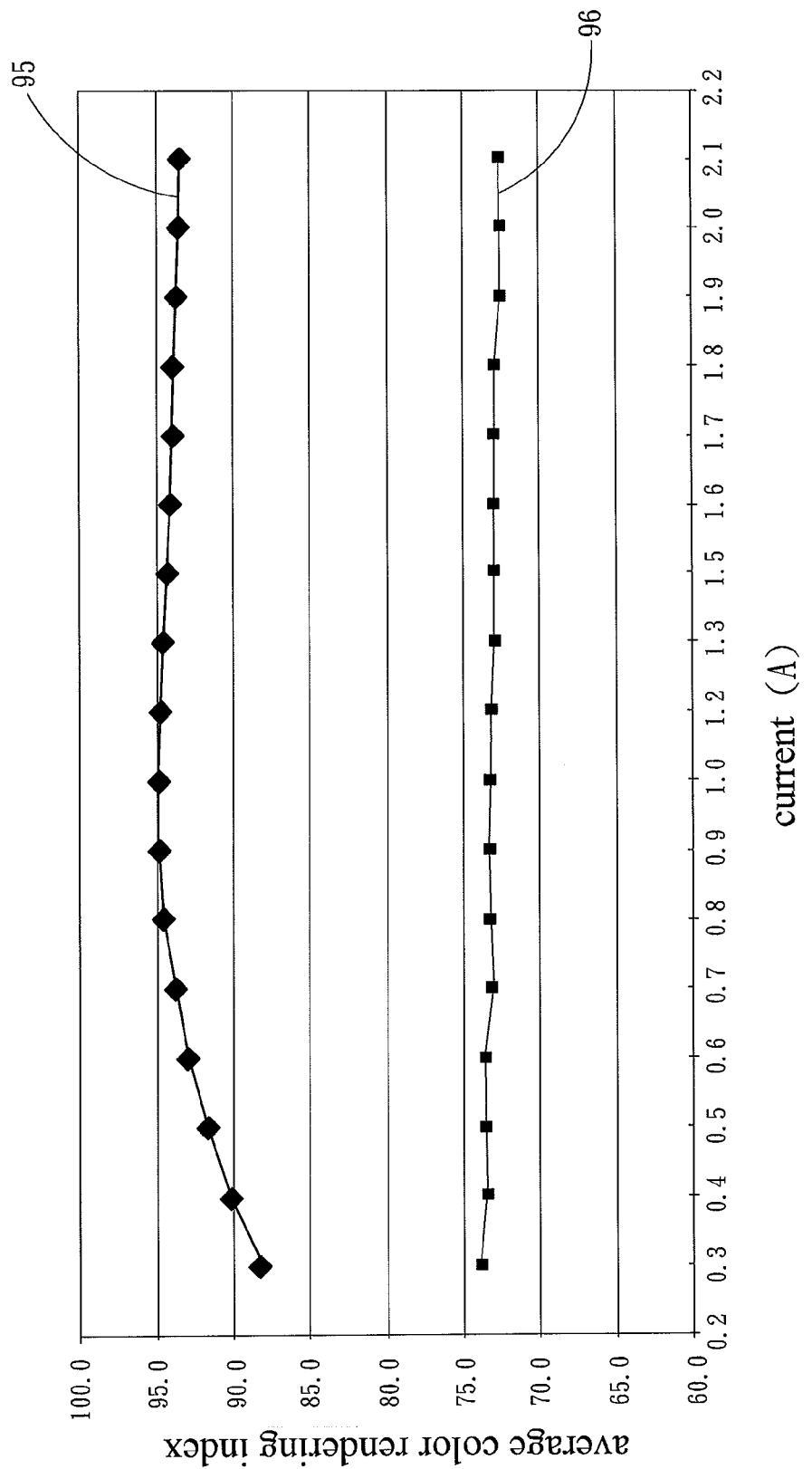
FIG. 7 is a comparison diagram of average color rendering indices of the present invention.

FIG. 6 and FIG. 7 show a coordinate diagram of chromaticity a CIE 1931 color space and a comparison diagram of an average CRI of the present invention, respectively. According to the foregoing structures and used materials, the white light 94 of the present invention falls in a warm white zone (a range x:0.41~0.50, y:0.36~0.45 in the coordinate diagram of the CIE 1931 color space). As shown in FIG. 7, the X-axis represents a current in a unit of amperes (A), the Y-axis represents an average CRI (Ra), a curve 95 (in rhombus dots) indicates the average CRI of the white light 94 of the present invention, and a curve 96 (in square dots) indicates an average CRI of a comparison reference. The comparison reference may be a white light generated by a common blue LED added with YAG yellow fluorescent power. As observed, it is apparent that the average CRI (Ra) of the present invention is much higher than that of the comparison reference.

In conclusion, in the present invention, a white light having a high CRI is formed through a design of multiple light emitting layers. Further, the electroluminescent light emitting structure 10 of the present invention generates the violet light 90, based on which the blue light 91 and the green light 92 are generated by a photoluminescent light emitting approach. Using a matured technology, the red light 93 is generated from a red light emitting substance, a photoluminescent red phosphorescent light emitting substance or red quantum dots. As the violet light 90 can be produced at a low cost, the present invention not only is capable of producing the white light 94 having a high CRI but also effectively reduces costs to satisfy manufacturing requirements.

What is claimed is:

1. An electroluminescent and photoluminescent multiband white light emitting diode (LED), comprising:
   an electroluminescent light emitting structure, comprising:
      an electroluminescent light emitting active layer, receiving a forward bias to emit a violet light having a wavelength between 390 nm and 450 nm and a full width at half maximum (FWHM) smaller than 25 nm; and
      a P-type semiconductor layer and a first N-type semiconductor layer disposed at two sides of the electroluminescent light emitting active layer, respectively;
   a first photoluminescent light emitting layer, spaced by the first N-type semiconductor layer to be disposed on the electroluminescent light emitting structure, adapted to absorb the violet light to emit a blue light;

a second photoluminescent light emitting layer, spaced by a second N-type semiconductor layer to be disposed on the first photoluminescent light emitting layer, adapted to absorb the violet light and the blue light to emit a green light; and a red light emitting layer, spaced by a protection layer and a third N-type semiconductor layer to be disposed on the second photoluminescent light emitting layer, adapted to generate a red light, the red light, the green light, the blue light and the violet light being blended to form a white light.

2. The electroluminescent and photoluminescent multi-band white LED of claim 1, wherein the red light emitting layer is one of a red light emitting substance, a photoluminescent red phosphorescent light emitting substance, and red quantum dots.

3. The electroluminescent and photoluminescent multi-band white LED of claim 1, wherein the blue light has a wavelength between 445 nm and 465 nm and an FWHM greater than 20 nm.

4. The electroluminescent and photoluminescent multi-band white LED of claim 1, wherein the green light has a wavelength between 490 nm and 540 nm and an FWHM greater than 20 nm.

5. The electroluminescent and photoluminescent multi-band white LED of claim 1, wherein the red light has a wavelength between 600 nm and 750 nm.

6. The electroluminescent and photoluminescent multi-band white LED of claim 1, wherein an area of the electroluminescent light emitting active layer is greater than or equal to those of the first photoluminescent light emitting layer and the second photoluminescent light emitting layer.

7. The electroluminescent and photoluminescent multi-band white LED of claim 1, further comprising:
    an N-type electrode, penetrating through the protection layer, the third N-type semiconductor layer, the second photoluminescent light emitting layer, the second N-type semiconductor layer and the first photoluminescent light emitting layer, the N-type electrode being in contact with the first N-type semiconductor layer;
    wherein, below the P-type semiconductor layer, a mirror layer, a buffer layer, a binding layer, a substrate and a P-type electrode are sequentially disposed.

8. The electroluminescent and photoluminescent multi-band white LED of claim 7, wherein a current block layer corresponding to the N-type electrode is disposed between the mirror layer and the buffer layer.

9. The electroluminescent and photoluminescent multi-band white LED of claim 1, wherein a non-doped semiconductor layer is further disposed between the protection layer and the third N-type semiconductor layer.

* * * * *